(12) United States Patent
Chang

(10) Patent No.: US 11,582,862 B2
(45) Date of Patent: Feb. 14, 2023

(54) MULTI-BAND RADIATION REDUCTION FILTER FOR A HIGH-SPEED DIFFERENTIAL SIGNAL TRACE

(71) Applicant: QUANTA COMPUTER INC., Taoyuan (TW)

(72) Inventor: Che-Wei Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 40 days.

(21) Appl. No.: 17/371,946

(22) Filed: Jul. 9, 2021

(65) Prior Publication Data

US 2023/0011538 A1 Jan. 12, 2023

(51) Int. Cl.
*H05K 1/02* (2006.01)
*H01P 1/20* (2006.01)
*H05K 3/10* (2006.01)

(52) U.S. Cl.
CPC ............ *H05K 1/0245* (2013.01); *H01P 1/20* (2013.01); *H05K 1/0216* (2013.01); *H05K 3/10* (2013.01)

(58) Field of Classification Search
CPC ...... H05K 1/0245; H05K 1/0216; H05K 3/10; H01P 1/20

USPC ......................................................... 361/748
See application file for complete search history.

(56) References Cited

U.S. PATENT DOCUMENTS

| 2011/0201234 A1* | 8/2011 | Long | H01R 12/721 439/630 |
| 2014/0182891 A1* | 7/2014 | Rengarajan | H05K 1/0222 174/251 |

* cited by examiner

*Primary Examiner* — Andargie M Aychillhum
(74) *Attorney, Agent, or Firm* — Nixon Peabody LLP

(57) ABSTRACT

A high-speed circuit includes a printed circuit board, a ground plane layer, a pair of first and second differential traces, and a cascading common mode filter. The printed circuit board has a first surface and an opposite second surface. The ground plane layer has a first surface in contact with the second surface of the printed circuit board. The pair of first and second differential traces are on the first surface of the printed circuit board. The first and second differential traces carry an electrical signal. The cascading common mode filter includes an outer and an inner common mode filter. The outer common mode filter includes a U-shaped void section on the first surface of the ground plane layer. The inner common mode filter includes an H-shaped void section on the first surface of the ground plane layer. The H-shaped void section is located proximate to the U-shaped void section.

10 Claims, 7 Drawing Sheets

MULTI-BAND RADIATION REDUCTION FILTER FOR A HIGH-SPEED DIFFERENTIAL SIGNAL TRACE

FIELD OF THE INVENTION

The present disclosure relates generally to high-speed differential traces. More particularly, aspects of this disclosure relate to a high-speed differential traces having a return path to reduce interference radiation in multiple frequency bands.

BACKGROUND OF THE INVENTION

High-speed differential signal traces are widely used in server/storage product designs. Many server/storage products include a chassis that mounts different printed circuit boards for electronic devices. The printed circuit boards include various signal traces to provide signals to the devices on the boards. Signal traces generally are arranged in differential trace pairs for a particular signal line. Such differential traces on a printed circuit board have different modes; including differential mode, common mode, and mode conversion between differential signals during transmission. Since more and more product applications include differential signal transition between different boards or between boards and cables, common mode energy will radiate through connectors over these transitions to holes in a chassis. Common mode energy results in a signal on both differential traces. Common mode energy can therefore generate noise that interrupts the transmission of signals over the traces and create interference problems.

FIG. 1 is an example of a prior art return current circuit trace 10 on a printed circuit board 12. The printed circuit board 12 is attached to a ground plane layer 14. The current circuit trace 10 includes two differential traces 22 and 24 on one surface 20 of the printed circuit board 12. The ground plane layer 14 contacts the opposite surface of the printed circuit board 12. An arrow 30 shows the insertion current in the differential trace 22. An arrow 32 shows an induction current in the differential trace 24. An arrow 34 shows a return current that is generated in the ground plane layer 14 under the differential trace 22. As shown in FIG. 1, common mode energy is generated by the insertion current represented by the arrow 30 minus coupling terms.

FIG. 2 is a graph of electronic signal interference from signals in a server chassis. The server chassis includes boards with differential traces similar to that shown in FIG. 1. The server chassis has several boards. The transition between the different boards allows common mode energy to radiate through holes in the chassis. A line 50 is the allowed noise for a trace in an FCC Class A digital device while a line 60 is the allowed noise for a system in an FCC Class A-AV device. As may be seen, the allowed noise level is lower for the more modern Class A-AV devices. A spike 80 represents unacceptable noise radiation at approximately 8 GHz frequency generated from an example system such as a server chassis.

To reduce radiation caused by common mode energy, there is a need for trace design that reduces common mode energy, while maintaining the total energy constant for the differential signals. Since high-speed traces can be used to transmit data at different frequencies, there is also a need for reducing interference and noise at the different transmitted frequencies of interest.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a high-speed circuit includes a printed circuit board, a ground plane layer, a pair of first and second differential traces, and a cascading common mode filter. The printed circuit board has a first surface and an opposite second surface. The ground plane layer has a first surface in contact with the second surface of the printed circuit board. The pair of first and second differential traces are on the first surface of the printed circuit board. The first and second differential traces carry an electrical signal. The cascading common mode filter includes an outer and an inner common mode filter. The outer common mode filter includes a U-shaped void section on the first surface of the ground plane layer. The inner common mode filter includes an H-shaped void section on the first surface of the ground plane layer. The H-shaped void section is located proximate to the U-shaped void section.

In an implementation, the U-shaped void section includes a first void section joined to a second void section by a third void section. The H-shaped void section includes a fourth void section joined to a fifth void section by a sixth void section. The sixth void section splits the fourth void section into a first part having a first length and a second part having a second length. In an implementation, the first and second void sections have identical shapes. In an implementation, the fourth and fifth void sections have identical shapes. In an implementation, the length of the second void section depends on canceling noise at a first radiation frequency, and the second length of the second part of the fourth void section depends on canceling noise at a second radiation frequency which is a harmonic of the first radiation frequency. In an implementation, a separation between the third void section and the sixth void section is greater than an ideal length of a void section when canceling noise at a target radiation frequency. In an implementation, the length of the first and second void sections are determined by the constraint:

$$L_1 = L_X - L_{4X}$$

$$2L_{4X} \geq L_2 \geq L_{4X}$$

$$L_3 \leq L_{4X}$$

$$L_4 = L_{2X}$$

$L_1$ is the length of the first and second void sections, $L_2$ is a separation between the third and sixth void sections, $L_3$ is the first length of the first part of the fourth void section, $L_4$ is the second length of the second part of the fourth void section, $L_X = 1/(4f \cdot TD)$, TD is the time delay per mil length for a differential signal propagating in the differential traces, and f is the target radiation frequency.

In an implementation, a distance between the first void section and the first differential trace and a distance between the second void section and the second differential trace are identical. In an implementation, a distance between the fourth void section and the first differential trace and a distance between the fourth void section and the second differential trace are identical. In an implementation, a distance between the first void section and the first differential trace is greater than a distance between the fourth void section and the first differential trace. In an implementation, a width of the H-shaped void section is smaller than a width of the U-shaped void section.

According to certain aspects of the present disclosure, a method for producing a low interference differential trace includes forming first and second differential traces on a first surface of a printed circuit board. A first void section is formed in a ground plane layer joined to a second surface of the printed circuit board. The second surface is opposite the first surface. A cascading common mode filter is formed on the ground plane layer by: (a) determining a length of a second void section based on a first target radiation frequency and joining the first and second void sections to form an outer common mode filter having a U-shape; (b) determining a length of a first part of a fifth void section based on a second target radiation frequency, the second target radiation frequency has a harmonic relationship to the first target radiation frequency; and (c) connecting the fifth void section to a fourth void section via a sixth void section to form an inner common mode filter having an H-shape. The width of the H-shape is smaller than the width of the U-shape.

In an implementation, the first and second void sections have identical shapes. In an implementation, the fourth and fifth void sections have identical shapes. In an implementation, the second target radiation frequency is two times the first target radiation frequency. In an implementation, the length of the first and second void sections are determined by the constraint:

$$L_1 = L_X - L_{4X}$$

$$2L_{4X} \geq L_2 \geq L_{4X}$$

$$L_3 \leq L_{4X}$$

$$L_4 = L_{2X}$$

$L_1$ is the length of the first and second void sections, $L_2$ is a separation between the third and sixth void sections, $L_3$ is the first length of the first part of the fourth void section, $L_4$ is the second length of the second part of the fourth void section, $L_X = 1/(4f*TD)$, TD is the time delay per mil length for a differential signal propagating in the differential traces, and f is the target radiation frequency.

In an implementation, a distance between the first void section and the first differential trace and a distance between the second void section and the second differential trace are identical. In an implementation, a distance between the fourth void section and the first differential trace and a distance between the fourth void section and the second differential trace are identical. In an implementation, a distance between the first void section and the first differential trace is greater than a distance between the fourth void section and the first differential trace.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
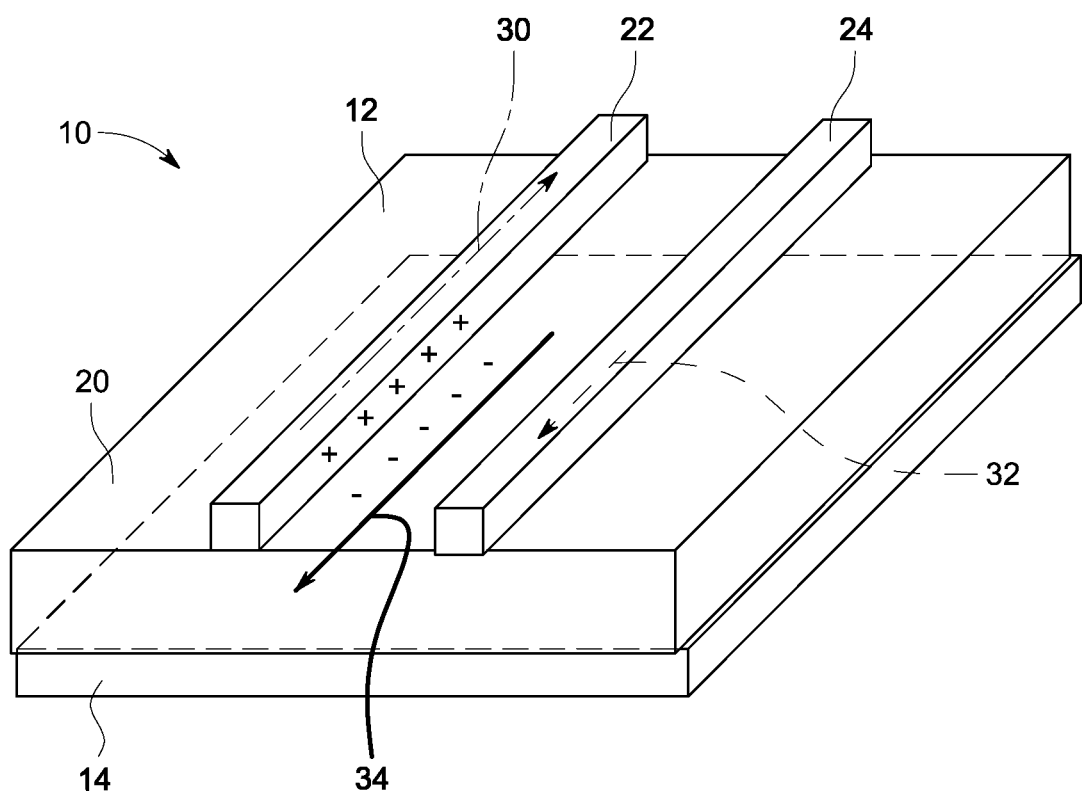
FIG. 1 is an example of a prior art differential trace on a printed circuit board.

The present disclosure provides a common mode filter for reducing signal radiation. The common mode filter is implemented in printed circuit board routing and can be used to reduce signal radiation in multiple frequency bands. In applications that require multi-data rate support, for example, peripheral component interconnect express (PCIe), SAS, etc., a common mode filter designed for one reduction band is not sufficient in reducing risk of radiation. As such, common mode filters provided by various embodiments of the present disclosure utilize a cascading technique to achieve radiation reduction for multiple radiation bands.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 3:
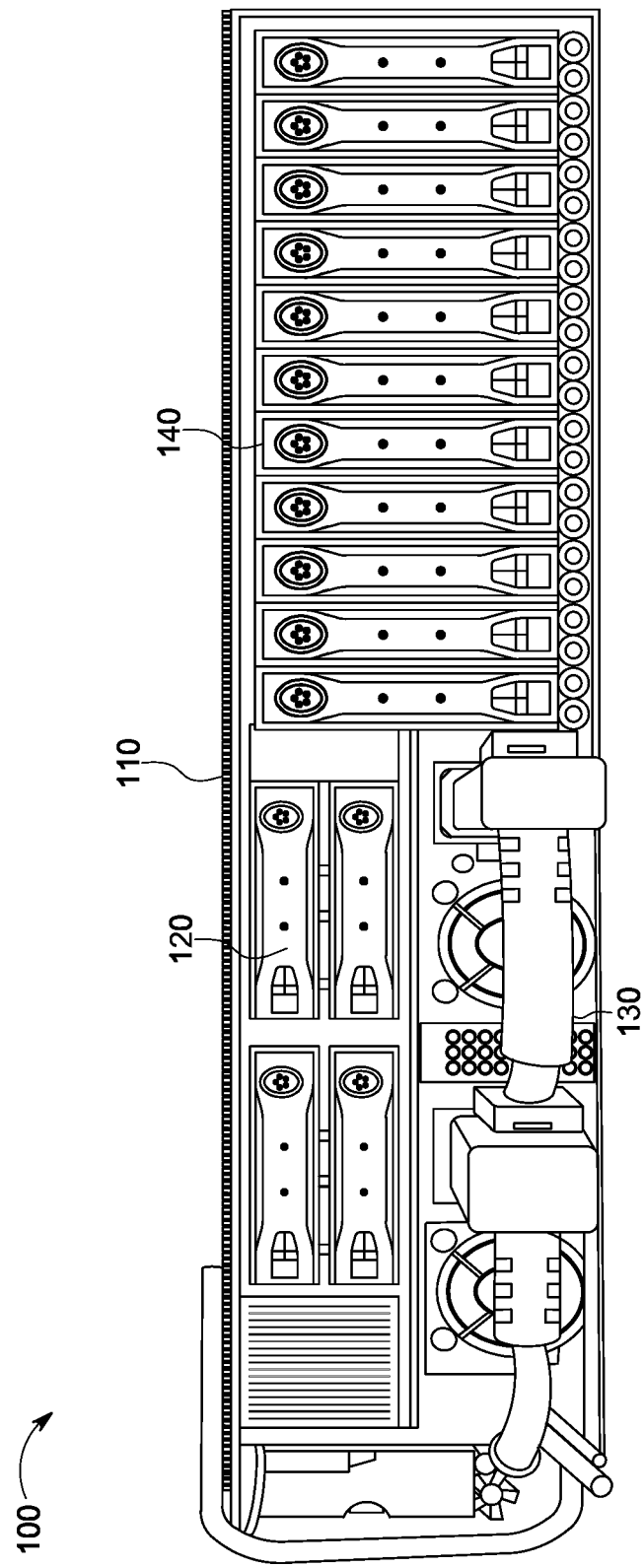
FIG. 3 is a back view of an electronic device including multiple circuit boards including traces having the example reduced interference return paths, according to certain aspects of the present disclosure.

Referring to FIG. 3, an example electronic device 100 is provided. The electronic device 100 is a server that includes a number of different components contained in a chassis 110. For example, one group of components 120 is mounted on one side of the chassis 110 above two power supply units 130. Another group of components 140 is mounted in vertical slots in the chassis 110. Each of the components in the groups of components 120 and 140 include printed circuit boards. The printed circuit boards include differential traces that connect electronic components on the boards and conduct signals between the components. The chassis 110 can have a number of holes through which noise generated from the circuit boards of the components 120 and 140 may be emitted.

Figure 2:
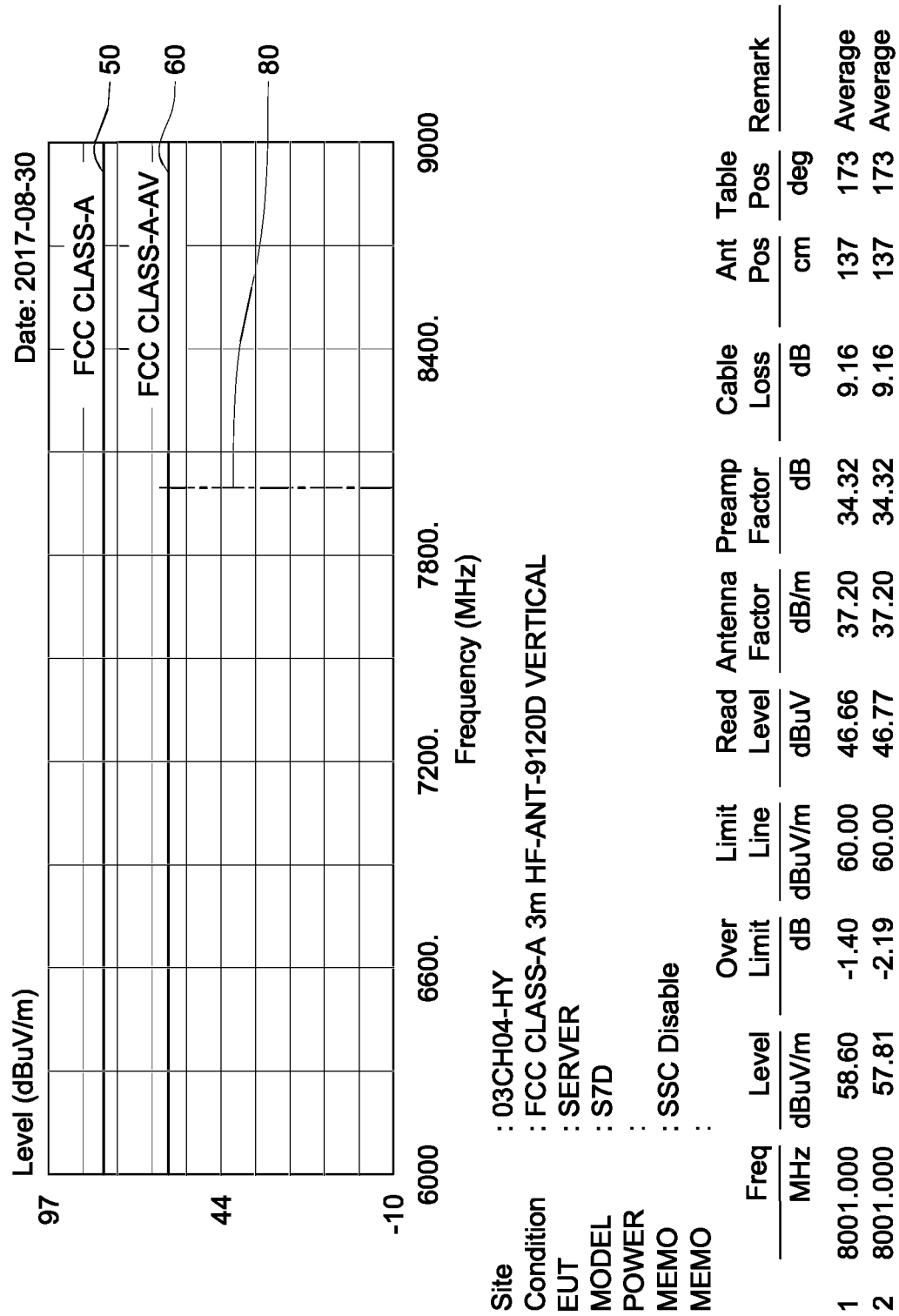
FIG. 2 is a graph of electronic signal interference at a specific frequency from signals from prior art differential traces in a chassis.

FIG. 2 is a graph that shows output noise through the holes in the chassis 110 with known differential trace circuits. As shown in FIG. 2, the output noise occurs at approximately 8 GHz in this example. The output noise is generated due to common mode energy from the differential traces on the circuit boards in the chassis.

In order to decrease this interference, each of the boards of the components 120 and 140 (in FIG. 3) includes differential traces that incorporate a return path design in the ground plane layer that reduces common mode energy at the target frequency of 8 GHz. The incorporation of such traces thereby decreases the electronic noise generated by the electronic device 100. The target frequencies are determined by interference testing of the chassis 110. The target frequency depends on the trace data rate transmitted on the boards in the chassis 110.

The process of designing a return trace to reduce common mode energy relies on the fact that a differential trace circuit may be modeled using a four port s-parameter. For a four port (2 signal trace) s-parameter, there are insertion terms $S_{31}$ and $S_{42}$ and induction terms $S_{41}$ and $S_{32}$. The induction terms have an opposite direction to the insertion terms based on Lenz's Law. Based on a mixed mode s-parameter formula, the differential mode output ($S_{dd21}$) of the differential signals is:

$$S_{dd21} = \frac{S_{31} - S_{32} + S_{42} - S_{41}}{2} \tag{Eq. 1}$$

The common mode output ($S_{cc21}$) of the differential signals is:

$$S_{cc21} = \frac{S_{31} + S_{32} + S_{42} + S_{41}}{2} \tag{Eq. 2}$$

In order to reduce common mode output energy, an increase in the coupling terms is desired. As shown in FIG. 1, there will be a return current for a differential signal, represented by the arrow 34, in the ground plane 14 just underneath the trace 22. The return current represented by the arrow 34 flows in the opposite direction of the current represented by arrow 30 in the trace 22. Thus, a return current path may be designed that results in destructive interference at a target frequency. In this situation, a nearby trace, such as the trace 24, will be the new path for the return current. This new return current path increases the coupling terms. Hence, the common mode will be greatly reduced. The formula for the length of the new return current path is:

$$L_X=1/(4f*TD) \tag{Eq. 3}$$

In this equation, $L_X$ is the length of the new path. TD is the time delay per mil length for the differential signal propagating in the trace, and f is the target radiation frequency.

Figure 4:
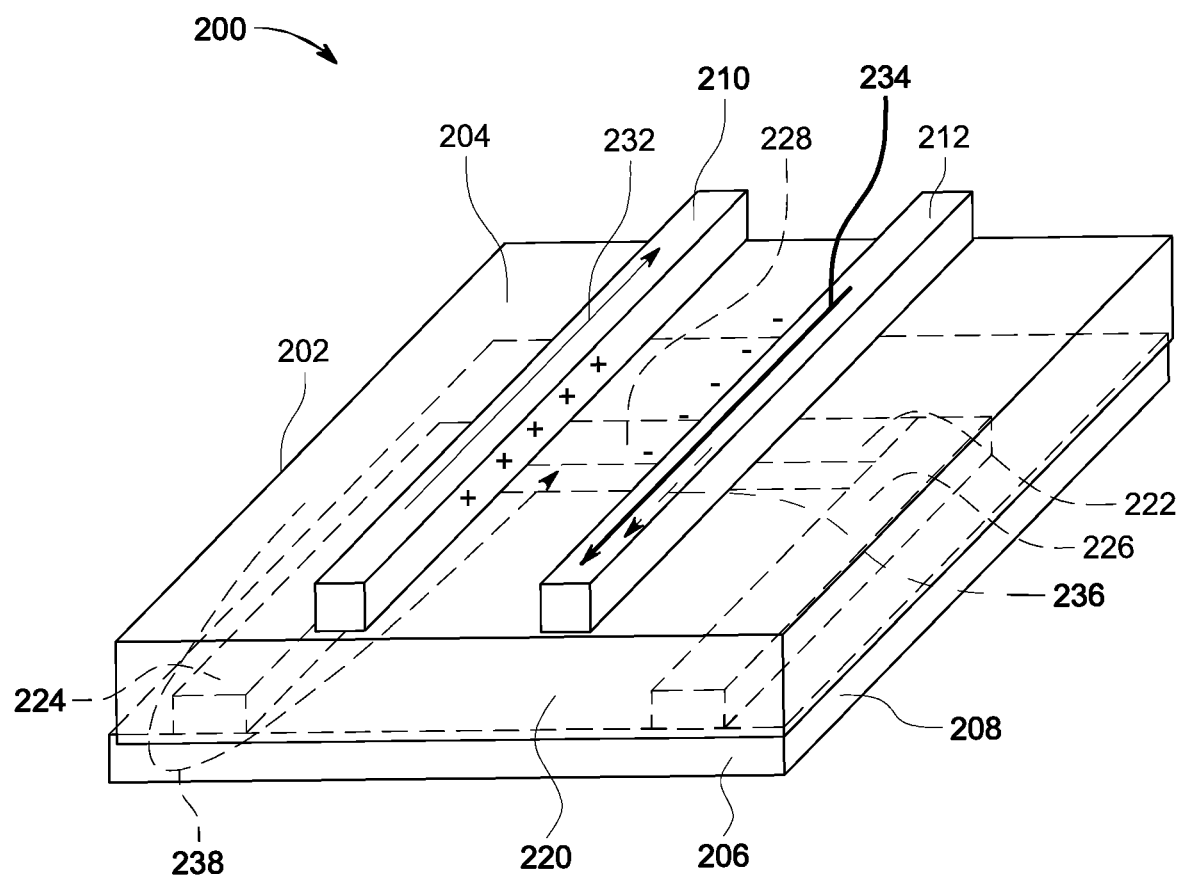
FIG. 4 is a perspective view of an example differential trace having a return path to reduce common mode energy, according to certain aspects of the present disclosure.

FIG. 4 is a perspective view of an example trace configuration 200 that is designed from the above criteria indicated in Eq. 3. The trace configuration 200 in FIG. 4 is formed on a printed circuit board 202. The printed circuit board 202 has a first surface 204, and an opposite second surface 206. The second surface 206 is in contact with a ground plane layer 208. Two parallel traces 210 and 212 are formed on the first surface 204 of the printed circuit board 202. The ground plane layer 208 has a first surface 220 that is in contact with the second surface 206 of the circuit board 202. A U-shaped current return path pattern 222 is created in the first surface 220 of the ground plane layer 208. The U-shaped current return path pattern 222 includes a first void section 224 that is located to the side of the trace 210 in this example. A void section is a patterned channel, empty space, or gap in material (e.g., in the ground plane layer 208). In an example, the ground plane layer 208 can be patterned in such a manner as described herein, and such patterning shapes the material of the ground plane layer 208 to include empty space, gaps, insulators, etc., that form void sections. The first void section 224 in this example is approximately parallel to the trace 210. The U-shaped pattern 222 also includes a second void section 226 that is located to the side of the trace 212 in this example. The second void section 226 is approximately parallel to the trace 212 in this example. A third void section 228 joins the first and second void sections 224 and 226. The first and second void sections 224 and 226, thus, are located in the ground plane layer 208 outside of the respective traces 210 and 212.

As may be seen in FIG. 4, an arrow 232 represents the insertion current in the trace 210. An arrow 234 represents the induction current that flows through the trace 212. The U-shaped pattern 222 causes destructive interference of any return current in the ground plane layer 208 at the desired frequency. Thus, an arrow 236 shows the return current has been shifted to the parallel trace 212. In doing so, destructive interference from the direction of the induction current 212 cancel the current generated from the opposite direction of the insertion current 232. A dashed line 238 represents the return current that is eliminated based on the destructive interference from the first, second, and third void sections 224, 226 and 228 of the U-shaped pattern 222.

In this example of FIG. 4, the U-shaped pattern 222 is desired to avoid a target radiation frequency (e.g., a target radiation frequency of 8 GHz). The length of the void section 226 constitutes the new current return path as determined by Eq. 3. In this example, given the target radiation frequency is 8 GHz and the time delay (TD) per mil is 1.4285*10-13, the length of the return path, $L_X$ at 8 GHz, is determined to be 437.5 mil.

Figure 5:
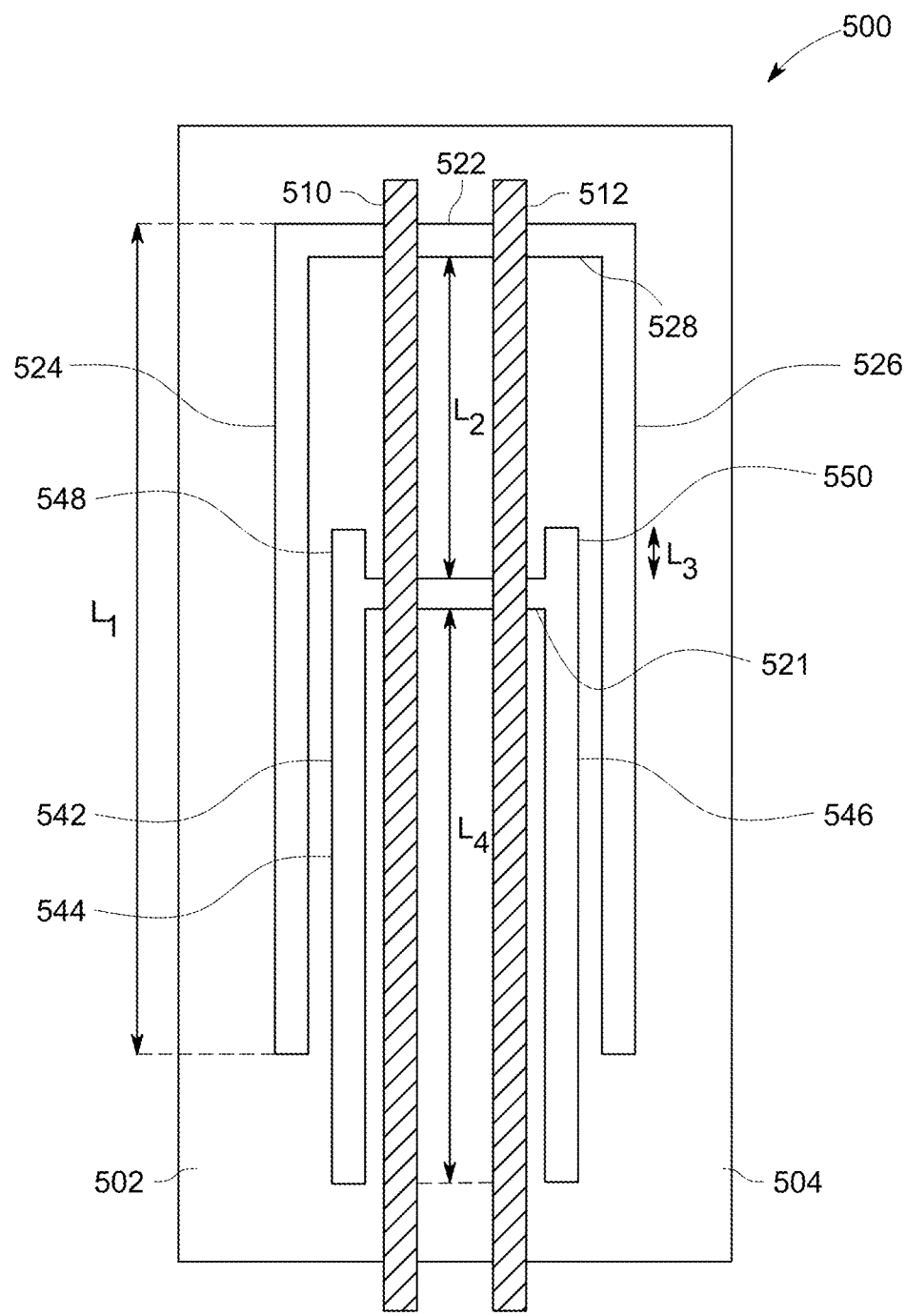
FIG. 5 is a top plan view of an example differential trace with a common mode filter, according to some implementations of the present disclosure, according to certain aspects of the present disclosure.

FIG. 4 shows a situation where design is performed for only one frequency. In the case where multiple target design frequencies are desired, a cascading structure is provided on the ground plane, as shown FIG. 5. FIG. 5 is a top plan view of an example differential trace 510, 512 with a cascading common mode filter 500, according to some implementations of the present disclosure. The cascading common mode filter 500 is provided on a printed circuit board 502 with the differential trace 510, 512 provided on a first surface 504 of the printed circuit board 502. The cascading common mode filter 500 includes an outer common mode filter 522 that is cascaded with an inner common mode filter 542. The outer common mode filter 522 is similar to or the same as the U-shaped pattern 222 of FIG. 4. The outer common mode filter 522 includes a first void section 524 and a second void section 526. The outer common mode filter 522 further includes a third void section 528 that joins the first and second void sections 524 and 526 to form the U-shape. Similar to FIG. 4, in FIG. 5, the first void section 524 is located to the side of the trace 510, and the second void section 526 is located to the side of the trace 512.

The inner common mode filter 542 forms an H-shaped pattern. The inner common mode filter 542 includes a fourth void section 544 to the side of the trace 510, a fifth void section 546 to the side of the trace 512, and a sixth void section 521 that joins the fourth and fifth void sections 544 and 546. By joining the fourth and fifth void sections 544 and 546 to form the H-shape, the sixth void section 521 splits the fourth void section 544 into a first part 550 of the fifth void section 546 and a second part 552 of the fifth void section 546. Similarly, a first part 548 of the fourth void section 544 is created alongside a second part 554 of the fourth void section 544.

Design lengths associated with the cascading common mode filter 500 are indicated in FIG. 5 as $L_1$, $L_2$, $L_3$, and $L_4$. $L_1$ is the length of the first void section 524 of the outer common mode filter 522. In some implementations, the lengths of the first and second void sections 524 and 526 are equal. Hence $L_1$ can also indicate the length of the second void section 526. In some implementations, the lengths of the first and second void sections 524 and 526 are not equal, with the length of the first void section 524 being larger (or smaller) than the length of the second void section 526. $L_2$ is the length of the separation between the third void section 528 and the sixth void section 521. $L_3$ is the length of the first part 548 of the fourth void section 544. In some implementations, the first part 548 of the fourth void section 544 and the first part 550 of the fifth void section 546 have the same length. $L_4$ is the length of the second part 554 of the fourth void section 544. In some implementations, the second part 552 of the fifth void section 546 and the second part 554 of the fourth void section 544 have the same length.

The cascading common mode filter 500 has design constraints surrounding the different lengths $L_1$, $L_2$, $L_3$, and $L_4$ for filtering out return current at multiple frequencies. The cascading common mode filter 500 provides additional inductance and capacitance and behaves as an LC filter for return current at the multiple frequencies.

In FIG. 5, dimensions of the inner common mode filter 542 and the outer common mode filter 522 are given by the following constraints in Eqs. 4a-4d.

$$L_1 = L_X - L_{4X} \quad \text{(Eq. 4a)}$$

$$2L_{4X} \geq L_2 \geq L_{4X} \quad \text{(Eq. 4b)}$$

$$L_3 \leq L_{4X} \quad \text{(Eq. 4c)}$$

$$L_4 = L_{2X} \quad \text{(Eq. 4d)}$$

In Eqs. 4a-4d, $L_X$ is path length for a common mode filter (e.g., U-shaped current return path pattern 222 of FIG. 4) to reduce radiation at a base frequency as defined in Eq. 3. $L_{2X}$ is path length for a common mode filter to reduce radiation at double of the base frequency, and $L_{4X}$ is path length for a common mode filter to reduce radiation at quadruple of the base frequency. Eq. 3 can be used to determine $L_X$, $L_{2X}$, and $L_{4X}$. From Eqs. 4a and 4d, $L_1$ and $L_4$, respectively, are fixed based on the chosen frequencies. That is $L_1$ is a difference between the path length determined for the base frequency and the path length determined for a frequency that is four times the base frequency. $L_4$ takes on the value of the path length for a frequency that is twice the base frequency. $L_2$ and $L_3$ can then be chosen to meet the constraints of Eqs. 4b and 4c.

Figure 6:
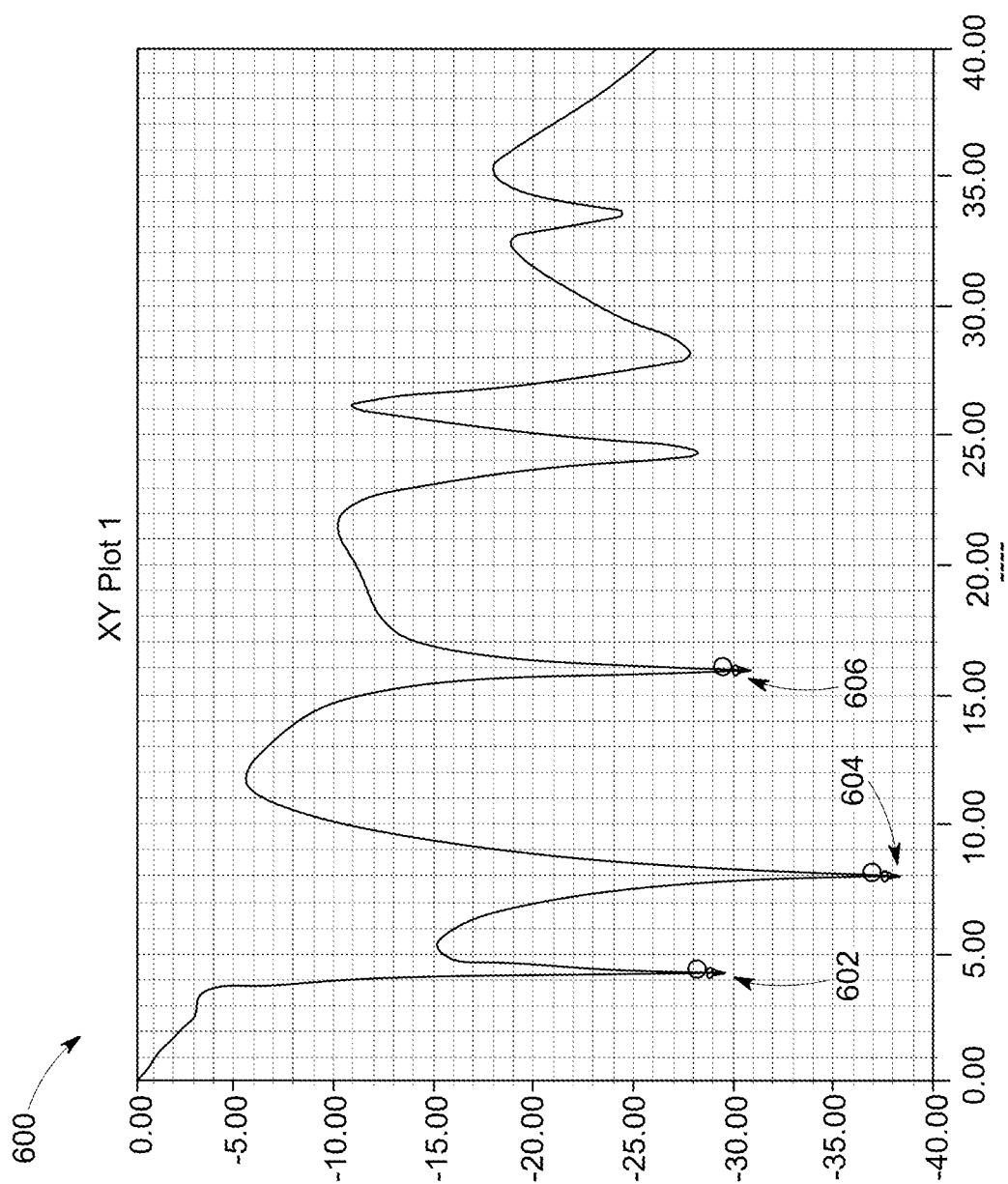
FIG. 6 is a graph of return current characteristics on a first one of the example differential trace in FIG. 5, according to certain aspects of the present disclosure.
Figure 7:
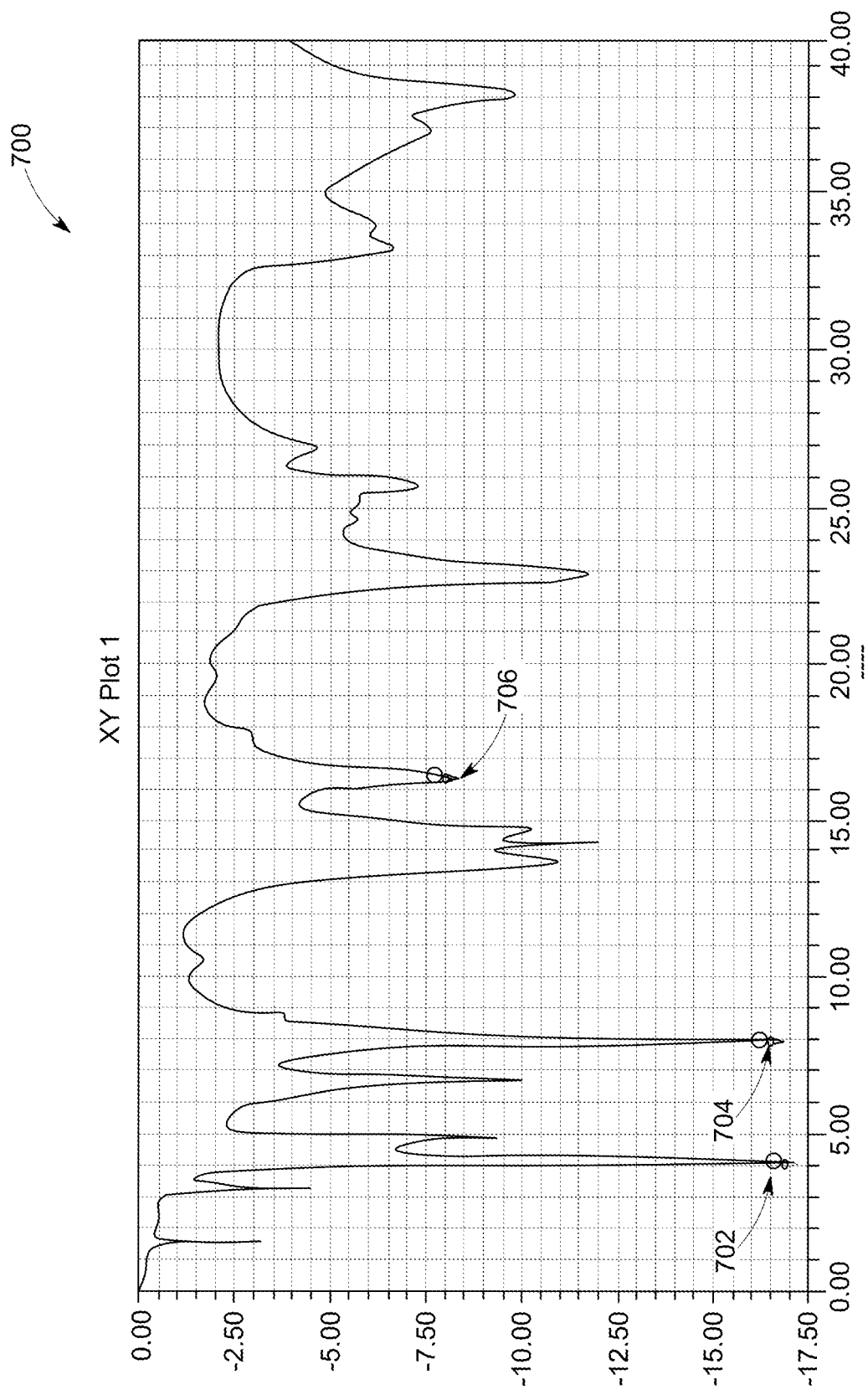
FIG. 7 is a graph of return current characteristics on a second one of the example differential trace in FIG. 5 according to certain aspects of the present disclosure.

FIGS. 6 and 7 provide simulation results for using the design constraints of Eqs. 4a-4d in choosing $L_1$, $L_2$, $L_3$, and $L_4$ for a cascading common mode filter, according to some implementations of the present disclosure. FIG. 6 is a graph 600 of return current characteristics on a first one of the example differential trace in FIG. 5. The example differential trace in FIG. 5 is a micro-strip structure with differential traces 510 and 512. For the micro-strip structure, $L_X$=526 mil (for 4 GHz), $L_{2X}$=263 mil (for 8 GHz), $L_{4X}$=132.5 mil (for 16 GHz). In this example, $L_1$=396 mil, $L_2$=132 mil, $L_3$=30 mil, $L_4$=263 mil. And, the reduction frequencies are 4.32 GHz, 8.09 GHz, and 15.97 GHz. As may be seen in FIG. 6, the drop in return current occurs at approximately at the reduction frequencies, which results in additional coupling and then reducing the common node noise at the specific frequencies. Marker 602 indicates a drop at 4.32 GHz, marker 604 indicates a drop at 8.09 GHz, and marker 606 indicates a drop at 15.97 GHz.

FIG. 7 is a graph 700 of return current characteristics on a second one of the example differential trace in FIG. 5 when fabricated in a strip-line structure. For the strip-line structure, $L_X$=464 mil (for 4 GHz), $L_{2X}$=232 mil (for 8 GHz), $L_{4X}$=116 mil (for 16 GHz). In this example, $L_1$=348 mil, $L_2$=116 mil, $L_3$=116 mil, $L_4$=232 mil. And, the reduction frequencies are 4.11 GHz, 8.0 GHz, and 16.39 GHz. As may be seen in FIG. 7, the drop in return current occurs at approximately at the reduction frequencies, which results in additional coupling and then reducing the common node noise at the specific frequencies. Marker 702 indicates a drop at 4.11 GHz, marker 704 indicates a drop at 8.0 GHz, and marker 706 indicates a drop at 16.39 GHz. The reduction frequencies are harmonically related. Embodiments of the present disclosure can be used to reduce interference in high speed traces, whether in micro-strip structures or in strip-line structures.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A high-speed circuit, comprising: a printed circuit board having a first surface and an opposite second surface; a ground plane layer having a first surface in contact with the second surface of the printed circuit board; a pair of first and second differential traces on the first surface of the printed circuit board, the first and second differential traces carrying an electrical signal; and a cascading common mode filter including an outer common mode filter including a U-shaped void section on the first surface of the ground plane layer; and an inner common mode filter including an H-shaped void section on the first surface of the ground plane layer, the H-shaped void section being located proximate to the U-shaped void section, wherein the U-shaped void section includes a first void section joined to a second void section by a third void section, wherein the H-shaped void section includes a fourth void section joined to a fifth void section by a sixth void section, the sixth void section splitting the fourth void section into a first part having a first length and a second part having a second length.

2. The high-speed circuit of claim 1, wherein the first and second void sections have identical shapes.

3. The high-speed circuit of claim 1, wherein the fourth and fifth void sections have identical shapes.

4. The high-speed circuit of claim 1, wherein the length of the second void section depends on canceling noise at a first radiation frequency, and the second length of the second part of the fourth void section depends on canceling noise at a second radiation frequency which is a harmonic of the first radiation frequency.

5. The high-speed circuit of claim 1, wherein a separation between the third void section and the sixth void section is greater than an ideal length of a void section when canceling noise at a target radiation frequency.

6. The high-speed circuit of claim 1, wherein the length of the first and second void sections are determined by a constraint:

$$L_1 = L_X - L_{4X}$$

$$2L_{4X} \geq L_2 \geq L_{4X}$$

$$L_3 \leq L_{4X}$$

$$L_4 = L_{2X}$$

wherein $L_1$ is the length of the first and second void sections, $L_2$ is a separation between the third and sixth void sections, $L_3$ is the first length of the first part of the fourth void section, $L_4$ is the second length of the second part of the fourth void section, $L_X = 1/(4f*TD)$, TD is time delay per mil length for a differential signal propagating in the first and second differential traces, and f is the target radiation frequency.

7. The high-speed circuit of claim 1, wherein a distance between the first void section and the first differential trace and a distance between the second void section and the second differential trace are identical.

8. The high-speed circuit of claim 1, wherein a distance between the fourth void section and the first differential trace and a distance between the fourth void section and the second differential trace are identical.

9. The high-speed circuit of claim 1, wherein a distance between the first void section and the first differential trace is greater than a distance between the fourth void section and the first differential trace.

10. The high-speed circuit of claim 1, wherein a width of the H-shaped void section is smaller than a width of the U-shaped void section.

* * * * *